United States Patent [19]

Huang

[11] Patent Number: 5,659,511

[45] Date of Patent: Aug. 19, 1997

[54] METHOD FOR MEASURING THE CURRENT LEAKAGE OF A DYNAMIC RANDOM ACCESS MEMORY CAPACITIVE JUNCTION

[75] Inventor: Heng-Sheng Huang, Taipei, Taiwan

[73] Assignee: United Microelectronics Corporation, Hsinchu, Taiwan

[21] Appl. No.: 643,363

[22] Filed: May 6, 1996

[51] Int. Cl.[6] .................................................. G11C 7/00
[52] U.S. Cl. ............................................ 365/201; 371/21.1
[58] Field of Search ................................. 365/201, 210; 371/21.1

[56] References Cited

U.S. PATENT DOCUMENTS

| | | | |
|---|---|---|---|
| 5,317,532 | 5/1994 | Ochii | 365/149 |
| 5,414,668 | 5/1995 | Nakashima et al. | 365/225.7 |
| 5,432,745 | 7/1995 | Tomita et al. | 365/201 |
| 5,459,684 | 10/1995 | Nakamura et al. | 365/149 |

Primary Examiner—David C. Nelms
Assistant Examiner—Hien Nguyen
Attorney, Agent, or Firm—Rabin, Champagne & Lynt, P.C.

[57] ABSTRACT

A method of measuring the leakage current of a DRAM capacitive junction involves the of following steps: A DRAM memory is formed on a semiconductor substrate. The DRAM memory comprises a plurality of RAM memory cells and a measuring memory cell. Each of the RAM memory cells and the measuring memory cell includes a transistor and a capacitor serially connected. The contact area of a bottom plate of the capacitor of the measuring memory cell is much larger than that of the RAM memory cells. A first junction leakage current value is measured while the transistor of the measuring memory cell is turned off. A second junction leakage current value is measured while the transistor of the measuring memory cell is turned on. The first junction leakage current value then is subtracted from the second junction leakage current value. By dividing the difference by the contact are of the bottom plate of the capacitor of the measuring memory cell, the capacitive junction leakage current value per unit area of the DRAM is obtained.

7 Claims, 2 Drawing Sheets

METHOD FOR MEASURING THE CURRENT LEAKAGE OF A DYNAMIC RANDOM ACCESS MEMORY CAPACITIVE JUNCTION

BACKGROUND OF THE INVENTION

1. Field of the Invention

This invention relates in general to a method of measuring the capacitive junction leakage current of a dynamic random access memory, especially to a method of precisely measuring the capacitive junction leakage current of a dynamic random access memory by enlarging the contact area.

2. Description of the Related Art

Dynamic random access memory (DRAM) is an electronic component widely used in different areas, especially in the computer industry. Typically, a memory cell of the DRAM consists of a transistor and a capacitor serially connected. The transistor includes a gate and paired source/drain regions. The capacitor is composed of two conductive electrodes with a dielectric layer therebetween. FIG. 1 is a cross-sectional diagram showing the structure of a conventional DRAM memory cell. Field oxide layer 11 is formed on a semiconductor substrate 10 to define an active area. After that, gate layer 12, source region 13 and drain region 14 are formed in sequence to construct a transistor. Then, a dielectric layer is deposited on the surface, and a contact window 19 is etched on the drain region 14. A capacitor is serially connected with the drain region 14 through the contact window 19. The capacitor consists of a first conductive layer or capacitance electrode 15, a dielectric layer 16, and a second conductive layer 17. The result is a conventional DRAM memory cell.

Generally speaking, a DRAM comprises a plurality of memory cells arranged in an array, wherein a bit line 18 is connected to the source region 13, and a word line is connected to date electrode layer 12. Data (0 or 1) is written in by applying a voltage on the bit line 18 to change the quantity of the stored charge in the capacitor. It can be concluded that the capacitance of the capacitor must be large enough both to prevent the influence of noise while reading out data, and to reduce the refresh period.

The value of the capacitance is determined by the surface area of the conductive layer, and the material and thickness of the dielectric layer. In addition, the leakage current from the capacitor must be considered. As shown in FIG. 1, due to the difference of carrier concentration, the charge in the first conductive layer or capacitance electrode 15 will go to the semiconductor substrate 10 through the drain region 14, while generating a capacitive junction leakage current $I_2$, which affects the capacitance and the refresh period. Therefore, the capacitive junction leakage current $I_2$ must be measured to evaluate the property of the DRAM. However, another junction leakage current $I_1$ goes under the bit line 18 from the source region 13 to the semiconductor substrate 10. Since leakage current $I_1$ is usually about 100 times larger than leakage current $I_2$, there has been no effective method to precisely measure the value of the capacitive junction leakage current $I_2$.

SUMMARY OF THE INVENTION

It is therefore an object of the invention to provide a method for measuring the DRAM capacitive junction leakage current, which amplifies the capacitive junction leakage current $I_2$ to achieve a precise measurement and to overcome the inability of the traditional method to measure junction leakage current precisely.

The invention achieves the above-identified objects by providing a method of measuring the leakage current of a DRAM capacitive junction. A DRAM is formed on a semiconductor substrate. The DRAM comprises a plurality of RAM memory cells (such as those illustrated in FIG. 1), and a measuring memory cell, wherein each of the RAM memory cells and the measuring memory cell consists of a transistor and a capacitor serially connected. The structure of the measuring memory cell and that of each RAM cell are generally the same except that the contact area between the capacitor and the drain region of the measuring memory cell is much larger than the contact area of each of the plurality of memory cells. A first junction leakage current value is measured when the transistor of the measuring memory cell is turned off. A second junction leakage current value is measured when the transistor of the measuring memory cell is turned on. The first junction leakage current value is subtracted from the second junction leakage current value to derive a net value. By dividing the net value by the contact area of the bottom plate of the capacitor of the measuring memory cell, the capacitive junction leakage current value per unit area of the DRAM is obtained.

BRIEF DESCRIPTION OF THE DRAWINGS

Other objects, features and advantages of the invention will become apparent by way of the following detailed description of the preferred but non-limiting embodiment. The description is made with reference to the accompanying drawings in which.

DESCRIPTION OF THE PREFERRED EMBODIMENT

Figure 1:
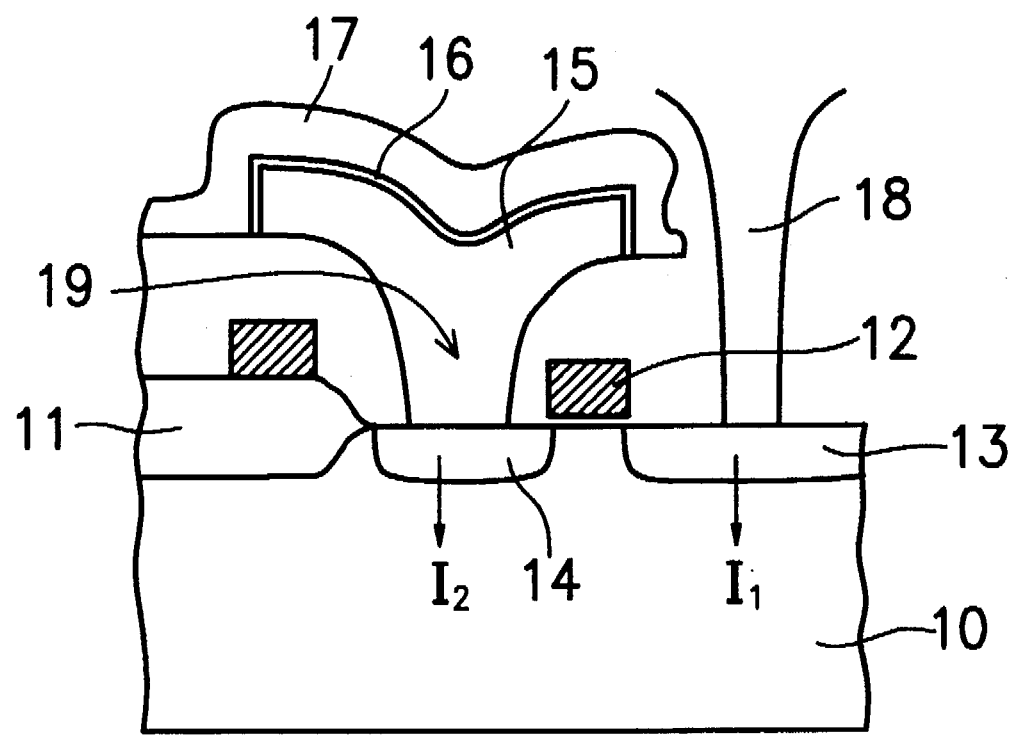
FIG. 1 is a schematic cross-sectional view illustrating the conventional structure of a DRAM.
Figure 2:
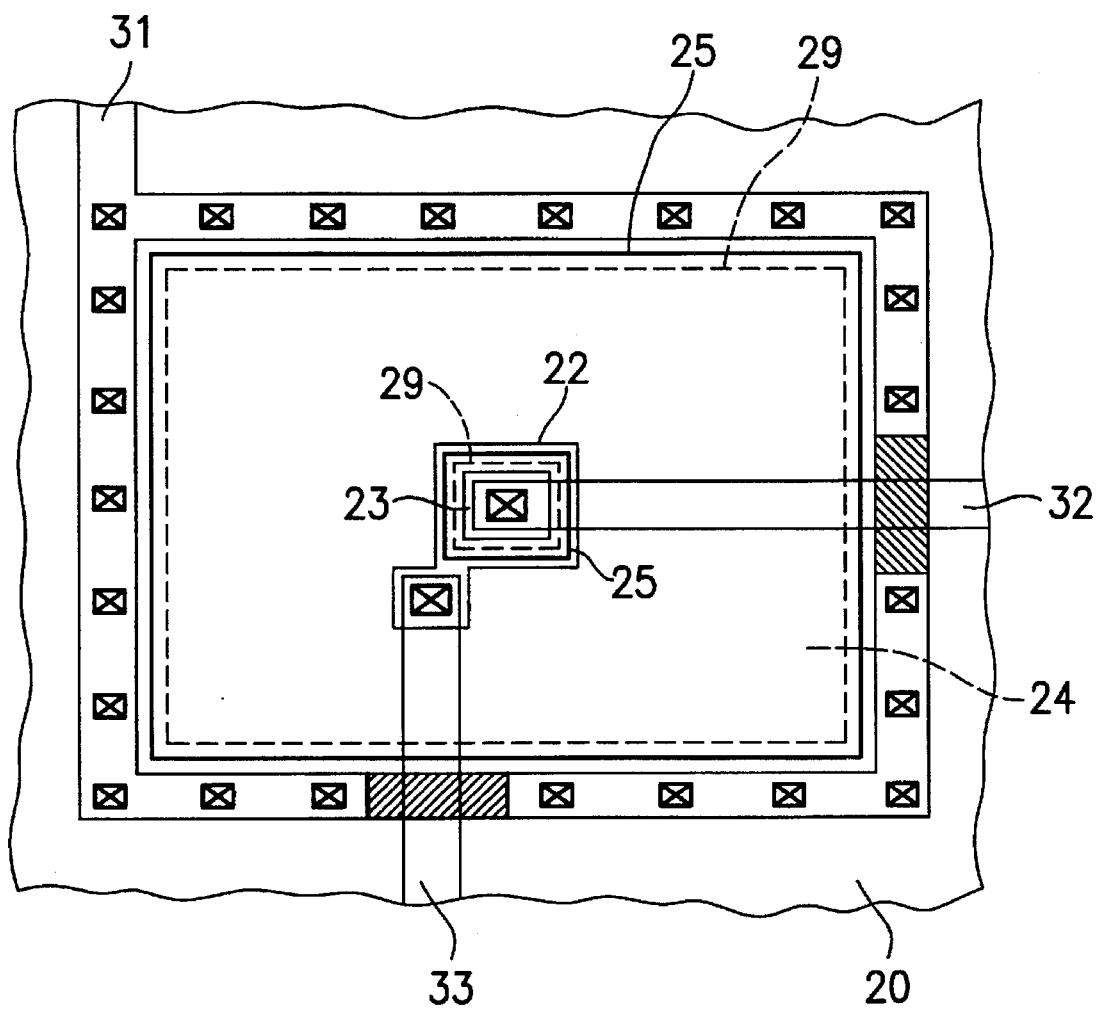
FIG. 2 is a schematic top view illustrating the layout pattern of a preferred embodiment of a measuring memory cell according to the invention.

In a preferred embodiment of the invention described hereinafter, a plurality of conventional RAM memory cells in an array (not shown in the drawing), and a measuring memory cell are formed on a semiconductor substrate. The RAM cells may be like those shown in FIG. 1 or of another suitable design. The measuring memory cell, which is illustrated in FIG. 2, has generally the same structure as that of the RAM cell. However, as will be explained in detail below, the area of the bottom plate of the capacitor of the measuring memory cell which contacts the transistor thereof, is much larger than the corresponding contact areas of the RAM memory cells, so that the capacitive junction leakage current can be amplified and measured precisely.

Many manufacturing processes and layout patterns of RAM cell arrays to which the invention may be applied are well known to those skilled in the art and will not be further discussed. The description hereinafter will focus on the manufacturing process of the measuring memory cell. Firstly, a first polysilicon layer, acting as a gate electrode layer 22 is formed on a semiconductor substrate 20. Using the gate electrode layer 22 as a mask, a source region 23 and a drain region 24 are formed by implantation, to construct a transistor element. A dielectric layer (not shown) is deposited thereon, and a contact window 29 is formed by etching. A capacitor element 25 is serially connected to the drain region 24 the contact window 29. In FIG. 2, a bottom plate or capacitance electrode 25a of the capacitor 25 is constructed by a second polysilicon layer with a much larger junction area than that of the RAM cell, that is, the area of contact between the drain region of its transistor and the bottom plate or capacitance electrode of its capacitor. The bottom plate 25a is formed in contact with the drain region 24. In the preferred embodiment, the layout pattern of the bottom plate 25a of the capacitor 25 is circular to obtain the maximum contact area on a small substrate. For example, the area of the bottom plate 25a could be about one hundred times larger than that of each RAM cell.

After completing the measuring memory cell, necessary metal interconnects are formed, wherein interconnect 31 is connected to substrate 20, interconnect 32 is connected to the source region 23 and interconnect 33 is connected to gate layer 22.

The measuring process of the invention is described as follow: Initially, a first predetermined voltage is supplied to the interconnect 33, to turn off the transistor. For example, an NMOS transistor could be turned off by grounding the interconnect 33. The junction leakage current value of the source is obtained by measuring a first junction leakage current value through the interconnects 31 and 32. Subsequently, a second voltage is supplied to the interconnect 33 to turn on the transistor. For example, an NMOS transistor could be turned on by supplying a high voltage. Thereupon, a second junction leakage current value is measured through interconnects 31 and 32. The latter leakage current value represents the sum of the junction leakage current value of the source and the capacitive junction leakage current value of the drain. Thus, the capacitive junction leakage current value is obtained by subtracting the first junction leakage current value from the second junction leakage current value. Since the contact area between the bottom plate 25a of the capacitor 25 of the measuring memory cell and the drain region 24 is large, the capacitive junction leakage current value so obtained is precise. Finally, the capacitive junction leakage current value is divided by the area of contact between the bottom plate 25a and the drain region 24, which is the area of the contact window 29, to obtain the capacitive junction leakage current value per unit area of the DRAM capacitor.

As stated above, since the layout pattern of the bottom plate of the capacitor is circular, a maximum contact area can be obtained on a small substrate to amplify the capacitive junction leakage current of the measuring memory cell. Therefore thecapacitive junction leakage current can be precisely measured, thus overcoming the disadvantage of the traditional method of detecting this memory cell property.

While the invention has been described by way of example and in terms of a preferred embodiment, it is to be understood that the invention need not be limited to the disclosed embodiments. To the contrary, it is intended to cover various modifications and similar arrangements as would be recognized by those skilled in the art and is limited only by the appended claims, which should be accorded the broadest interpretation.

What is claimed is:

1. A method for measuring leakage current per unit area of a capacitive junction of a dynamic random access memory, comprising the steps of:

a. forming the dynamic random access memory on a semiconductor substrate, the dynamic random access memory including a plurality of RAM memory cells and a measuring memory cell, wherein each of the RAM memory cells and the measuring memory cell includes a transistor and a capacitor serially connected, and a contact area of a bottom plate of the capacitor of the measuring memory cell is much larger than a contact area of the RAM memory cells;

b. measuring a first junction leakage current value, with the transistor of measuring memory cell turned off;

c. measuring a second junction leakage current value, with the transistor of the measuring memory cell turned on; and d. obtaining the capacitive junction leakage current per unit area of the dynamic random access memory by subtracting the first junction leakage current value from the second junction leakage current value and dividing the difference by the contact area of bottom plate of the capacitor of the measuring memory cell.

2. A method according to claim 1, wherein the bottom plate of the capacitor of the measuring memory cell is circular.

3. A method according to claim 1, wherein the contact area of the bottom plate of the measuring memory cell is about 100 times the contact area of a capacitance electrode of each RAM memory cell.

4. A method for measuring leakage current per unit area of a capacitive junction of a dynamic random access memory, comprising the steps of:

a. forming the dynamic random access memory on a semiconductor substrate, the dynamic random access memory including a plurality of RAM memory cells and a measuring memory cell, wherein each of the RAM memory cells and the measuring memory cell includes a transistor and a capacitor serially connected, and a contact area between a capacitance electrode of the capacitor of the measuring memory cell and the transistor of the measuring memory cell is much larger than a contact area between a capacitance electrode of the capacitor of each RAM memory cell and the transistor of said each RAM memory cell;

b. measuring a first junction leakage current value, with the transistor of measuring memory cell turned off;

c. measuring a second junction leakage current value, with the transistor of the measuring memory cell turned on; and d. obtaining the capacitive junction leakage current per unit area of the dynamic random access memory by subtracting the first junction leakage current value from the second junction leakage current value and dividing the difference by the contact area of bottom plate of the capacitor of the measuring memory cell.

5. A method according to claim 4, wherein the capacitance electrode of the capacitor of the measuring memory cell is circular.

6. A method according to claim 4, wherein the contact area of the measuring memory cell is about 100 times the contact area of each RAM memory cell.

7. A method according to claim 4, wherein the contact area of the capacitor of the measuring memory cell is an area of contact between the capacitance electrode of the capacitor of the measuring memory cell and a drain of the transistor of the measuring memory cell, and wherein the contact area of each RAM memory cell is an area of contact between the capacitance electrode of the capacitor of each RAM memory cell and the drain of the transistor of said each RAM memory cell.

* * * * *